(12) United States Patent
Fathimulla et al.

(10) Patent No.: US 6,743,662 B2
(45) Date of Patent: Jun. 1, 2004

(54) SILICON-ON-INSULATOR WAFER FOR RF INTEGRATED CIRCUIT

(75) Inventors: Mohammed A. Fathimulla, Ellicott City, MD (US); Thomas Keyser, Plymouth, MN (US)

(73) Assignee: Honeywell International, Inc., Morristown, NJ (US)

( * ) Notice: Subject to any disclaimer, the term of this patent is extended or adjusted under 35 U.S.C. 154(b) by 78 days.

(21) Appl. No.: 10/186,494

(22) Filed: Jul. 1, 2002

(65) Prior Publication Data

US 2004/0002197 A1 Jan. 1, 2004

(51) Int. Cl.[7] .................. H01L 21/44; H01L 21/46; H01L 29/93
(52) U.S. Cl. .................. 438/118; 438/406; 438/455; 438/458; 438/459; 148/DIG. 12; 257/593; 257/676; 257/701
(58) Field of Search .................. 438/118, 455, 438/458, 406, 459, 676; 257/593, 701; 148/DIG. 12

(56) References Cited

U.S. PATENT DOCUMENTS

| | | | | |
|---|---|---|---|---|
| 5,168,078 A | * | 12/1992 | Reisman et al. | 438/455 |
| 5,266,135 A | * | 11/1993 | Short et al. | 438/455 |
| 5,362,667 A | * | 11/1994 | Linn et al. | 438/455 |
| 5,387,555 A | * | 2/1995 | Linn et al. | 438/455 |
| 5,569,620 A | * | 10/1996 | Linn et al. | 438/406 |
| 5,728,624 A | * | 3/1998 | Linn et al. | 438/459 |
| 5,773,355 A | * | 6/1998 | Inoue et al. | 438/459 |
| 5,801,084 A | * | 9/1998 | Beasom et al. | 438/457 |
| 5,849,627 A | * | 12/1998 | Linn et al. | 438/455 |
| 6,150,197 A | * | 11/2000 | Boles et al. | 438/128 |
| 6,183,857 B1 | * | 2/2001 | Litwin et al. | 428/328 |
| 6,239,004 B1 | * | 5/2001 | Aga et al. | 438/455 |
| 6,251,751 B1 | * | 6/2001 | Chu et al. | 438/439 |
| 6,255,731 B1 | * | 7/2001 | Ohmi et al. | 257/758 |
| 6,265,248 B1 | * | 7/2001 | Darmawan et al. | 438/155 |
| 6,291,324 B1 | * | 9/2001 | Lescot et al. | 438/510 |
| 6,352,909 B1 | * | 3/2002 | Usenko | 438/458 |
| 6,388,290 B1 | * | 5/2002 | Celler et al. | 257/350 |
| 6,410,371 B1 | * | 6/2002 | Yu et al. | 438/151 |
| 6,465,324 B2 | * | 10/2002 | Vogt et al. | 438/425 |
| 2002/0008268 A1 | * | 1/2002 | Babcock et al. | 257/302 |
| 2002/0092307 A1 | * | 7/2002 | Ghoshal | 62/3.7 |

OTHER PUBLICATIONS

I. Lagnado et al., RF System Based on Silicon–on–Saphire Technology, Oct. 200, IEEE, 2000 IEEE International Conference, Oct. 2000, pp. 32–33.*

James G. Fiorenza et al., RF Power LDMOSFET on SOI, Mar. 2001, IEEE, vol. 22 No. 3, IEEE Electron Device LEtters, pp. 139–141.*

Satoshi Matsumoto et al. A High–Efficiency Thin–Film SOI Power MOSFET Having a Self–Aligned Offset Gate structure for Multi_Gegahertz Applications. Jun. 2001, IEEE, IEEE Transactions on Electron devices, vol. 48, No. 6, Jun. 2001 pp. 1270–1274.*

Y. Hiraoka et al., New Substrate–crosstalk reduction structure using SOI substrate, Oct. 2001, IEEE International SOI Conference, p. 107–108.*

V. Cuocs et al., A Novel vertical DMOS Transistor in SOA Technology for RF–power Applications, May 2002, Proc. 23rd. International Conference On MicroElectronics(MIEL 2002), vol. 1 NIS, Yugoslaia, May 12–15, 2002 pp. 159–161.*

(List continued on next page.)

*Primary Examiner*—Long Pham
*Assistant Examiner*—Shrinivas H. Rao
(74) *Attorney, Agent, or Firm*—Schiff Hardin LLP

(57) ABSTRACT

An RF semiconductor device is fabricated from a starting substrate comprising a polysilicon handle wafer, a buried oxide layer over the polysilicon handle wafer, and a silicon layer over the oxide layer.

15 Claims, 5 Drawing Sheets

OTHER PUBLICATIONS

Alberto O. Adan et al., LInerarity and Low–Noise Performance of SOI MOSFETs for RF Applications., May 2002, IEEE TRansactions on Electron Devices, vol. 49, No. 5, May 2002, pp. 881–888.*

Peter Van Zant, MIcrochip Fabrication, A practical Guide to Semiconductor Processing, Fourth Edition, McGraw–Hill, pp. 32–34.*

Satoshi Matsumoto et al., A Novel High_Speed Quasi–SOI Power MOSFET with Supressed Parasitic Bipolar Effect Fabricated by reversed Siulicon Wafer Direct Bonding,96–1996, IEDM, pp. 18.81 to 18.8.03.*

Digh Hisamoto et al., Silicon RF Devices Fabricated by ULSI Processes Featuring ).1 Um SOI_CMOS and Suspended Inductors, 1996, Symposium on VLSI Technology Digest Of Techinical Papers , IEEE, pp. 104–105.*

Satoshi Matsumoto et al., Study on the Device Characterisitcs of a Quasi–SOI Power MOSFET Fabricated by reversed Silicon wafer Direct Bonding, Sep. 1998, vol. 45, No. 9, IEEE, pp. 1940–1945.*

A.O.Adan et al., SOI as a Mainstream IC Technology, Oct. 1998, Proceedings 1998 IEEEInterantional SOI Conference pp. 9–12.*

* cited by examiner

# SILICON-ON-INSULATOR WAFER FOR RF INTEGRATED CIRCUIT

TECHNICAL FIELD OF THE INVENTION

The present invention relates to silicon-on-insulator (SOI) wafers for RF integrated circuits.

BACKGROUND OF THE INVENTION

The material requirements for the initial processing of the silicon used in a particular application are driven by that application. For RF applications, these material requirements are very stringent. Standard bulk silicon wafers or silicon-on-insulator wafers use low resistivity substrates that result in high losses and cross-talk at high frequencies. For example, the Q's of inductors fabricated using silicon wafers or silicon-on-insulator wafers having low resistivity substrates are low. Therefore, multi-level metals with a ground plane are used in order to achieve higher Q's. However, these coupling techniques result in cross-talk. In addition, losses increase at higher frequencies due to the low resistivity of the substrates.

Losses and coupling (cross-talk) in RF applications may be reduced by using high resistivity silicon (HRS) substrates. Such substrates have maximum resistivities $\rho$ of $10^4$ $\Omega$-cm as compared to a resistivity $\rho$ of about 10 $\Omega$-cm for the silicon substrate typically used. However, the resistivity of HRS is 3–4 orders of magnitude lower than a GaAs substrate commonly used for RF applications. In addition, there is a problem with using high resistivity silicon substrates in RF applications. That is, during post-processing, thermally generated donors degrade the resistivity both at the $SiO_2$/Si interface and at the back of the wafer, as shown by the graphs in FIGS. 1 and 2.

FIG. 1 is a resistance profile at the interface between the buried oxide and the substrate (i.e., the $SiO_2$/Si interface) where the substrate is assumed to be an n-type substrate. The y-axis of FIG. 1 represents resistivity, and the x-axis represents depth into the substrate. The point at which x=0 is at the interface. As shown in FIG. 1, the resistivity of the substrate is lowest just below the interface.

FIG. 2 is a resistance profile across a p-type wafer. The y-axis of FIG. 2 represents resistivity, and the x-axis represents depth into the wafer. The point at which x=0 is at the front surface of the wafer. As shown in FIG. 2, the back of the wafer, under certain conditions, may actually undergo a conversion in type (in this case, from p type to n type). It has also been observed that, under other conditions, the region of the wafer just below the buried oxide may also undergo a conversion in type.

The degradation at the back of the wafer may be removed by grinding. However, the degradation at the interface produces higher losses, increases coupling (cross-talk), lowers inductor Q, and is not so easily remedied. The present invention solves one or more of these problems

SUMMARY OF THE INVENTION

In accordance with one aspect of the present invention, an RF semiconductor device comprises a high resistivity polysilicon handle wafer, a buried oxide layer over the polysilicon handle wafer, and a silicon layer over the buried oxide layer.

In accordance with another aspect of the present invention, an RF semiconductor device comprises a high resistivity polycrystalline layer, a buried oxide layer over the polycrystalline layer, and a silicon layer over the buried oxide layer.

In accordance with still another aspect of the present invention, a method of fabricating an RF semiconductor device comprises the following: forming an oxide layer on a surface of a first wafer, wherein the first wafer comprises low resistivity silicon; and, bonding the oxide layer of the first wafer to a second wafer, wherein the second wafer comprises a high resistivity polysilicon wafer, whereby the RF semiconductor device is produced.

In accordance with yet another aspect of the present invention, a method of fabricating an RF semiconductor device comprises the following: forming a first oxide layer on a surface of a first wafer, wherein the first wafer comprises a high resistivity polycrystalline material; forming a second oxide layer on a surface of a second wafer, wherein the second wafer comprises low resistivity silicon; and, bonding the first and second oxide layers against one another so as to produce the RF semiconductor device.

In accordance with a further aspect of the present invention, a method is provided to fabricate an RF semiconductor device starting with a SOI wafer having a top silicon layer, a buried oxide layer, and a bottom silicon layer. The method comprises the following: forming a new oxide layer on a surface of the top silicon layer; forming a high resistivity polysilicon layer over the new oxide layer; removing the bottom silicon layer of the SOI wafer; and, removing the buried oxide layer of the SOI wafer so as to produce the RF semiconductor device.

BRIEF DESCRIPTION OF THE DRAWINGS

These and other features and advantages of the present invention will become more apparent from a detailed consideration of the invention when taken in conjunction with the drawings in which.

DETAILED DESCRIPTION

Figure 3:
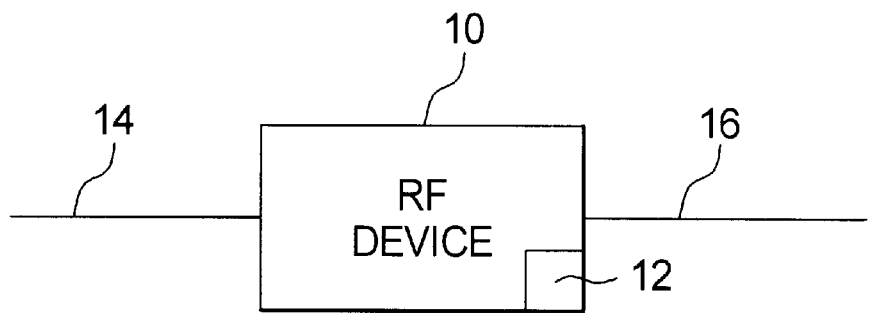
FIG. 3 illustrates an RF device that advantageously uses the present invention.
Figure 4:
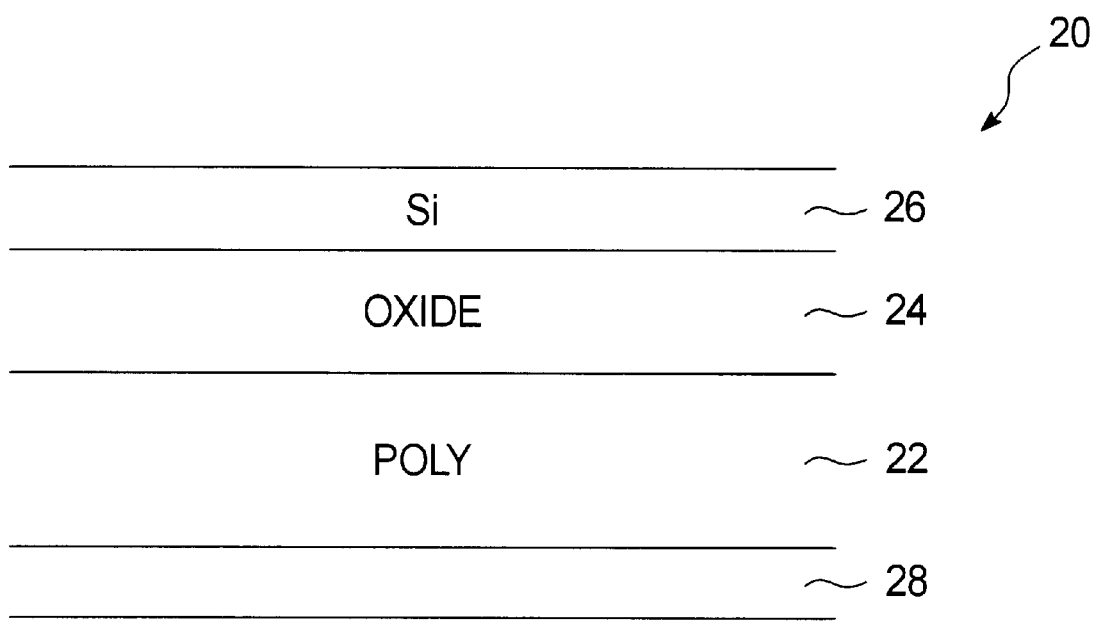
FIG. 4 shows a wafer according to the present invention which may be used in the RF device of FIG. 3.

As shown in FIG. 3, an RF device 10 incorporates an integrated circuit 12 and has an RF input 14 and an output 16. An RF substrate 20 that may be used during the fabrication of the integrated circuit 12 is shown in FIG. 4. The RF substrate 20 includes a high resistivity polysilicon handle wafer 22, a buried oxide layer 24 formed over the polysilicon handle wafer 22, and a silicon layer 26 formed over the buried oxide layer 24. The silicon layer 26 of the RF substrate 20 may be then processed to form RF components, such as transistors, capacitors, diodes, varactors, and inductors, incorporated to form the RF device 10.

The buried oxide layer 24 may be $SiO_2$ or $Al_2O_3$. Alternatively, a layer of AlN or $Si_3N_4$ may be substituted for the buried oxide layer 24. An additional layer 28 may be provided to control stress and also to reduce any warping of the RF substrate 20 and to act as a barrier layer against contamination impurities. The additional layer 28 may be provided, for example, by oxidizing the polysilicon of the polysilicon handle wafer 22 or by depositing $Si_3N_4$ on the polysilicon handle wafer 22.

The polysilicon of the polysilicon handle wafer 22 has a high resistivity $\rho$ such as a resistivity $\rho$ greater than $10^6$ $\Omega$-cm. Also, polysilicon is less susceptible to the degradation, such as type conversion, that occurs with the single crystal materials heretofore used. Moreover, high resistivity polysilicon suffers less loss of resistivity during processing.

Figure 5A:
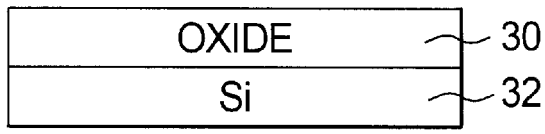
FIGS. 5a, 5b, and 5c illustrate a process of preparing the RF substrate 20 illustrated in FIG. 4.
Figure 5B:
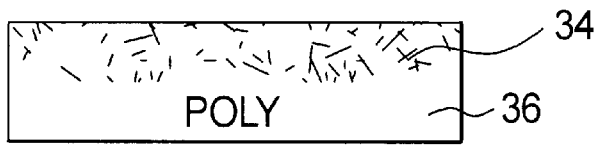
Figure 5C:
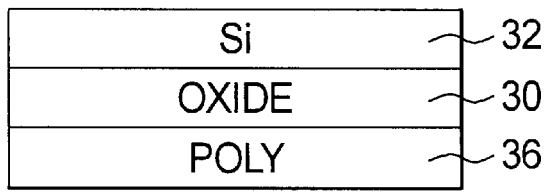

A process of preparing the RF substrate 20 is illustrated in FIGS. 5a, 5b, and 5c. As shown in FIG. 5a, an oxide layer 30 is formed on a surface of a first wafer 32 of single crystal silicon. This oxide layer should have the desired thickness of the buried oxide layer 24. As shown in FIG. 5b, low atomic weight atoms 34, such as hydrogen or helium atoms, may be implanted in a surface of a polycrystalline wafer 36, where the material of the polysilicon wafer 36. As shown in FIG. 5c, the oxidized layer 30 of the first wafer 32 and the implanted surface of the second wafer 36 are bonded against one another, such as by use of a heat treatment. During heating, the implanted atoms form macrobubbles, and the silicon film above the implanted region is typically released. The resulting structure is the RF substrate 20 which may be polished as needed. The additional layer 28 can be added as desired.

Figure 6A:
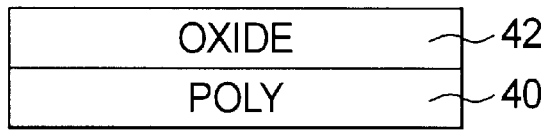
FIGS. 6a, 6b, and 6c illustrate an alternative process of preparing the RF substrate 20 illustrated in FIG. 4; and, FIGS. 7a, 7b, 7c, 7d, and 7e illustrate a further alternative process of preparing the RF substrate 20 illustrated in FIG. 4.
Figure 6B:
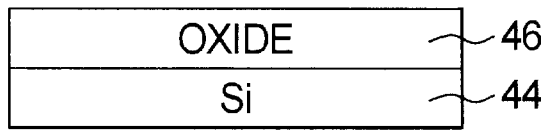
Figure 6C:
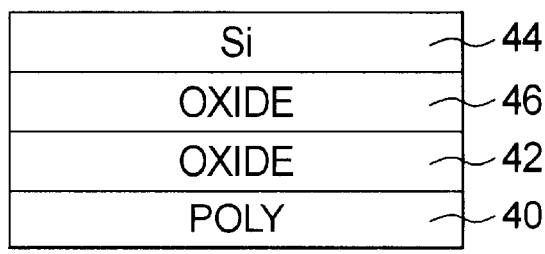

Alternatively, as illustrated in FIGS. 6a, 6b, and 6c, the RF substrate 20 may be prepared by oxidizing a surface of a first wafer 40 of a polycrystalline material, such as polysilicon, to form an oxide layer 42 (FIG. 6a). As shown in FIG. 6b, a surface of a second wafer 44 comprising single crystal silicon is oxidized to form an oxide layer 46. As shown in FIG. 6c, the oxidized layers 42 and 46 of the first and second wafers 40 and 44 are bonded together such as by use of a heat treatment. The combined depth of the oxide layers 42 and 46 should result in the desired thickness of the buried oxide layer 24. If necessary, a portion of the exposed silicon surface of the second wafer 44 is removed such as by grinding and/or etching to produce the desired RF substrate 20 having a top silicon layer of a desired depth. If etching is used, a doped layer may be used in the single crystal wafer before bonding to stop the etching at a desired point. The additional layer 28 can be added as desired.

Figure 7A:
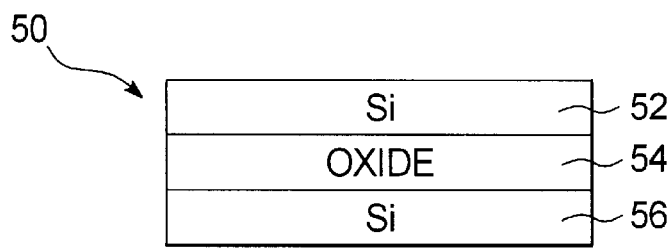
Figure 7B:
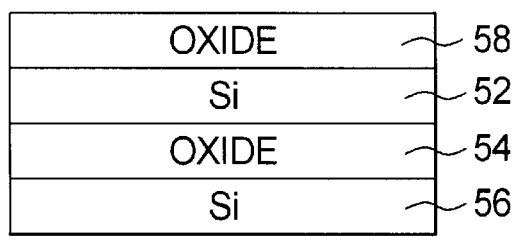
Figure 7C:
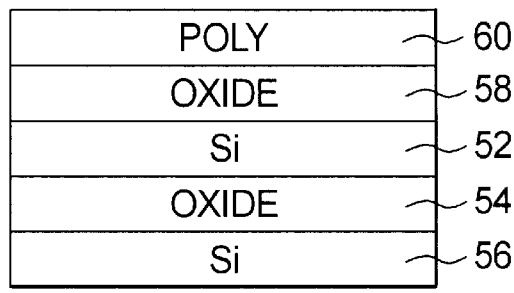
Figure 7D:
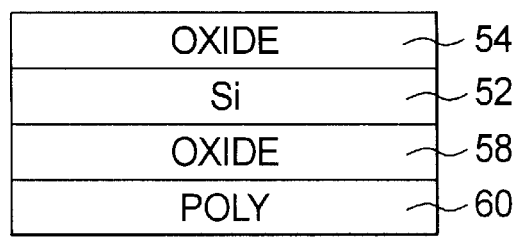
Figure 7E:
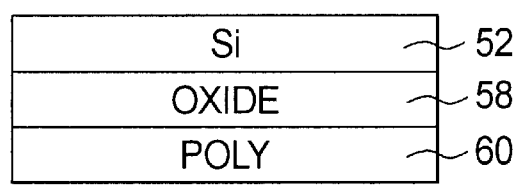

As a further alternative illustrated in FIGS. 7a, 7b, 7c, 7d, and 7e, the RF substrate 20 can be fabricated by starting with a standard SOI wafer 50 having a top silicon layer 52, a buried oxide layer 54, and a thick bottom silicon layer 56 (FIG. 7a). As shown in FIG. 7b, the top silicon layer 52 of the SOI wafer 50 is oxidized to form an oxide layer 58. As shown in FIG. 7c, a polysilicon layer 60 is formed over the oxide layer 58 such as by deposition. The resulting polysilicon layer may have a thickness, for example, of 500 $\mu$m for a wafer of 4 inches. As shown in FIG. 7d, the thick bottom silicon layer 56 of the original SOI wafer 50 is removed, such as by etching and/or grinding. Finally, as shown in FIG. 7e, the oxide layer 54 of the original SOI wafer 50 is removed, such as by etching and/or grinding, leaving the RF substrate 20. The additional layer 28 can be added as desired.

Certain modifications of the present invention have been discussed above. Other modifications will occur to those practicing in the art of the present invention. For example, the buried oxide layers 24 and 54 described herein may be comprised of one or a combination of such dielectrics as $SiO_2$, $Si_3N_4$, $Al_2O_3$, AlN, titanates, etc. The buried oxide can be deposited using such deposition techniques as CVD, LPCVD, sputtering, MBE, PECVD, high density plasma and thermal growth.

Moreover, the other oxide layers can be selected from one or a combination of such dielectrics as $SiO_2$, $Si_3N_4$, $Al_2O_3$, AlN, titanates, etc. These other oxide layers can be deposited using such deposition techniques as CVD, LPCVD, sputtering, MBE, PECVD, high density plasma and thermal growth.

Accordingly, the description of the present invention is to be construed as illustrative only and is for the purpose of teaching those skilled in the art the best mode of carrying out the invention. The details may be varied substantially without departing from the spirit of the invention, and the exclusive use of all modifications which are within the scope of the appended claims is reserved.

We claim:

1. A method of fabricating an RF semiconductor device comprising:

forming an oxide layer on a surface of a first wafer, wherein the first wafer comprises low resistivity silicon; and, bonding the oxide layer of the first wafer to a second wafer, wherein the second wafer comprises a high resistivity polysilicon wafer, whereby the RF semiconductor device is produced.

2. The method of claim 1 wherein the bonding of the oxide layer of the first wafer to the second wafer comprises:

implanting low atomic weight atoms in a surface of the second wafer; and, bonding the oxide layer of the first wafer to the implanted surface of the second wafer.

3. The method of claim 1 wherein the bonding of the oxide layer of the first wafer to the second wafer comprises heating the first and second wafers so as to bond the oxide layer of the first wafer to the second wafer.

4. The method of claim 3 wherein the heating of the first and second wafers so as to bond the oxide layer of the first wafer to the second wafer comprises:

implanting low atomic weight atoms in a surface of the second wafer; and, heating the first and second wafers so as to bond the oxide layer of the first wafer to the implanted surface of the second wafer.

5. The method of claim 1 further comprising processing the silicon of the first wafer to form an integrated circuit of the RF semiconductor device therein.

6. The method of claim 1 further comprising processing the silicon of the first wafer to form transistors and inductors.

7. A method of fabricating an RF semiconductor device comprising:

forming a first oxide layer on a surface of a first wafer, wherein the first wafer comprises a high resistivity polycrystalline material;

forming a second oxide layer on a surface of a second wafer, wherein the second wafer comprises low resistivity silicon; and, bonding the first and second oxide layers against one another so as to produce the RF semiconductor device.

8. The method of claim 7 wherein the polycrystalline material comprises polysilicon.

9. The method of claim 7 further comprising removing a portion of the silicon of the second wafer.

10. The method of claim 9 wherein the removing of a portion of the silicon of the second wafer comprises etching away the portion of the silicon of the second wafer.

11. The method of claim 9 wherein the removing of a portion of the silicon of the second wafer comprises grinding away the portion of the silicon of the second wafer.

12. The method of claim 9 wherein the removing of a portion of the silicon of the second wafer comprises etching and grinding away the portion of the silicon of the second wafer.

13. The method of claim 7 wherein the bonding of the first and second oxide layers against one another comprises heating the first and second wafers so as to bond the first and second oxide layers against one another.

14. The method of claim 7 further comprising processing the silicon of the second wafer to form an integrated circuit of the RF semiconductor device therein.

15. The method of claim 7 further comprising processing the silicon of the second wafer to form transistors and inductors.

* * * * *

UNITED STATES PATENT AND TRADEMARK OFFICE
CERTIFICATE OF CORRECTION

Figure 1:
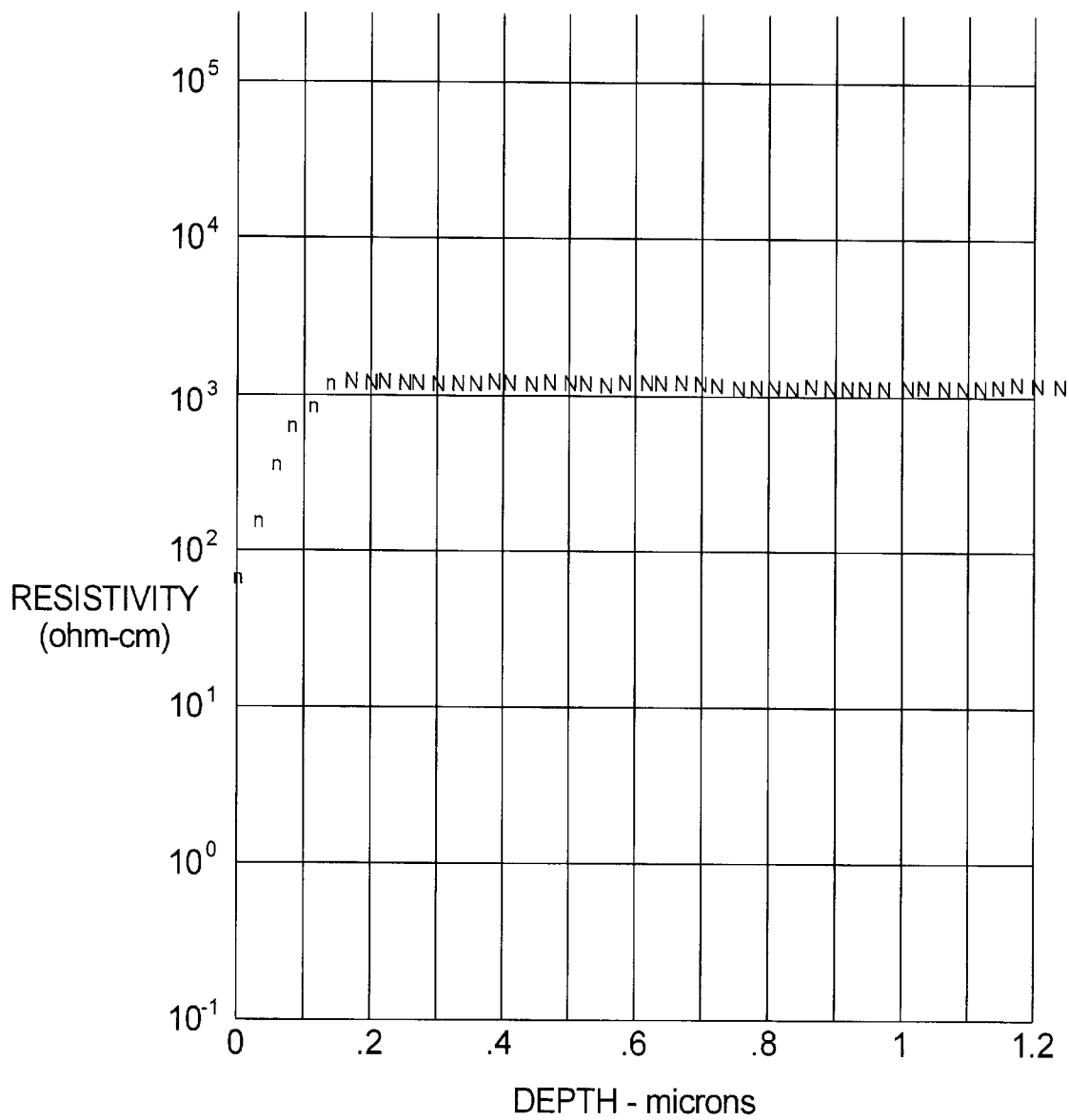
FIG. 1 illustrates is a resistance profile at the interface between the buried oxide and the substrate of a conventional Silicon-on-Insulator wafer.
Figure 2:
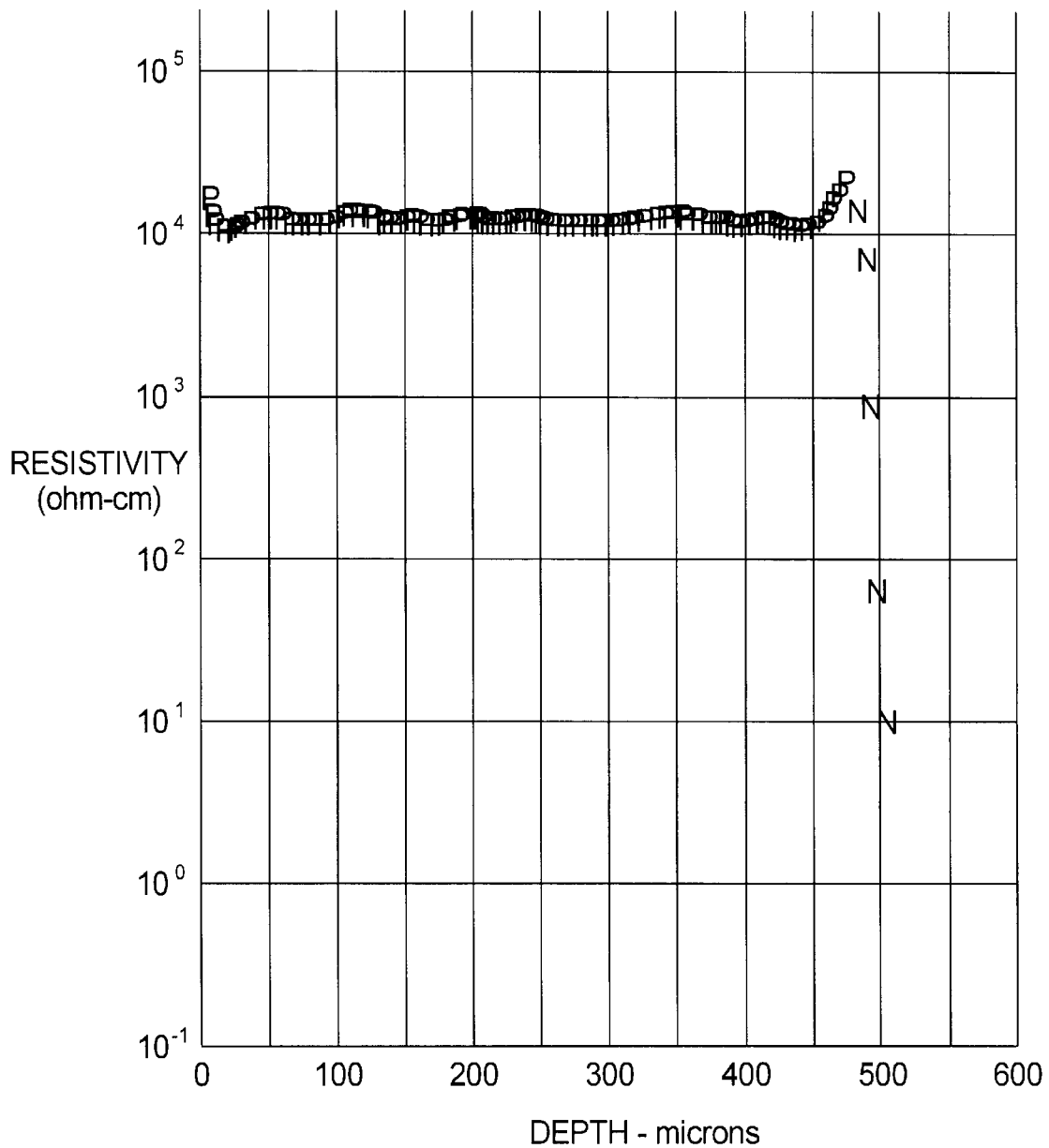
FIG. 2 illustrates a resistance profile across a conventional p-type wafer following standard CMOS processing.

PATENT NO.   : 6,743,662 B2
DATED        : June 1, 2004
INVENTOR(S)  : Mohammed A. Fathimulla and Thomas Keyser It is certified that error appears in the above-identified patent and that said Letters Patent is hereby corrected as shown below:

Drawings,
Figures 1 and 2 should have been labeled with the legend "Prior Art".

Signed and Sealed this

Twelfth Day of April, 2005

JON W. DUDAS
*Director of the United States Patent and Trademark Office*